US006864185B2

United States Patent
Yang et al.

(10) Patent No.: US 6,864,185 B2
(45) Date of Patent: Mar. 8, 2005

(54) FINE LINE PRINTING BY TRIMMING THE SIDEWALLS OF PRE-DEVELOPED RESIST IMAGE

(75) Inventors: Ta-Hung Yang, Hsinchu (TW); Chin-Cheng Yang, Hsinchu (TW); Ching-Yu Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/643,000

(22) Filed: Aug. 18, 2003

(65) Prior Publication Data

US 2004/0170929 A1 Sep. 2, 2004

Related U.S. Application Data

(60) Provisional application No. 60/403,964, filed on Aug. 16, 2002.

(51) Int. Cl.[7] ...................... H01L 21/302; H01L 21/461
(52) U.S. Cl. ...................... 438/736; 438/725; 430/322
(58) Field of Search .................... 438/736, 705, 438/734, 725; 430/322, 394; 4430/396

(56) References Cited

U.S. PATENT DOCUMENTS

| 5,415,835 A | * | 5/1995 | Brueck et al. | 430/311 |
| 5,759,744 A | * | 6/1998 | Brueck et al. | 430/312 |
| 6,620,564 B2 | * | 9/2003 | Hung et al. | 430/30 |

* cited by examiner

*Primary Examiner*—Caridad Everhart
(74) *Attorney, Agent, or Firm*—Stout, Uxa, Buyan & Mullins, LLP

(57) ABSTRACT

A method of forming a feature pattern in a photosensitive layer includes forming the photosensitive layer on a substrate, providing a first mask having a first opaque area thereon, and performing a first exposure process with a first dose to form a first unexposed image in the photosensitive layer. The method further includes performing a second exposure process with a second dose to expose sidewalls of the first unexposed image so that the sidewalls of the first unexposed image receive at least a portion of the second dose thus forming a second unexposed image in the photosensitive layer, and developing the photosensitive layer with a developing process to form the feature pattern and to create features having smaller widths than those which would result in developing the photosensitive layer of the first unexposed image.

34 Claims, 9 Drawing Sheets

FINE LINE PRINTING BY TRIMMING THE SIDEWALLS OF PRE-DEVELOPED RESIST IMAGE

CROSS-REFERENCE TO RELATED APPLICATIONS

This application claims the benefit of U.S. Provisional Application No. 60/403,964, entitled METHOD OF SHRINKING SELECT FEATURES, filed Aug. 16, 2002, the entire contents of which are hereby incorporated by reference.

BACKGROUND OF THE INVENTION

1. Field of the Invention

The present invention relates generally to semiconductor processing and, more particularly, to photoresist patterning.

2. Description of Related Art

One of the processing steps used during manufacturing processes for fabricating transistors, conductive lines and via is photolithography. Photolithography is used numerous times during typical manufacturing processes and is one of the more important as well as one of the more limiting processes for determining a maximum density and final reliability of a given integrated circuit. Photolithography is particularly important in positioning the transistors, interconnect layers and via and in ensuring their uniformity.

A typical photolithographic process is implemented by depositing onto a working surface, by means such as a spinner, a layer of photosensitive resist that can be patterned by exposure to ultraviolet (UV) light or another radiation type. The working surface may be a semiconductor wafer, interconnect layer or other layer depending on the current manufacturing stage of the integrated circuit. The photoresist layer is sensitive to light and may be patterned based on exposing the photoresist to a corresponding pattern of light.

When exposed to light, photoresist may either be hardened or softened, depending on the type of photoresist used. Positive photoresist, also known as light-softening photoresist, can be depolymerized by exposure to radiation such as UV light. Therefore, with positive photoresist, areas exposed to radiation are dissolved upon placement in a developer, while the masked, unexposed areas remain unaffected. On the other hand, negative photoresist, which is a light-hardening photoresist, can be polymerized by exposure to radiation, meaning that the exposed areas remain, while the covered areas are dissolved. Thus, depending on the type of photoresist utilized, the pattern transferred to the photoresist on the wafer is either a positive or a negative image of the photomask pattern.

To undergo exposure, the photoresist-covered wafer is placed beneath a photomask designed to prevent the penetration of radiation through certain portions of the photoresist. Predetermined areas of the photoresist then undergo a degree of polymerization or depolymerization, which can be a function of the nature and extent of photoresist exposure. The photomask forms the pattern by utilizing areas that block the light and other areas that allow the light to pass from the light source to the photoresist layer. The pattern of light created by the photomask is typically for a single die on a wafer. A lens may be positioned between the photomask and the photoresist layer to reduce the size of the pattern and to focus the pattern of light onto the die. A lithography tool steps from one die to the next die on the wafer and repeats the process until all selected die on the wafer have been exposed to the pattern of light created by the photomask.

A chemical bath known as a developer can then be used to dissolve parts of the photoresist that remain relatively depolymerized after the exposure by placing the wafer therein and allowing the wafer to be rinsed for a designated time period. Having received the pattern from the photomask, the layer of photoresist on the wafer is typically referred to as a layer of patterned photoresist. The presence or absence of photoresist across a working surface creates a pattern or template to be used by subsequent processing steps of the integrated circuit. For example, an etching or an ion implantation process may be used after the lithography step on the exposed areas without photoresist to continue the manufacturing process of the integrated circuit. In conventional methods, plasma etching is typically used to trim features of the post development patterns of photoresist. However, this approach may be unable to perform pattern selection. Using double exposure with strong phase-shifting masks (PSMs) may be implemented to reduce the dimensions of features of a photoresist pattern. The costs of using strong PSMs, however, can be relatively high.

A need thus exists in the prior art to efficiently shrink feature widths of patterned photoresist layers in a selective manner. A further need exists for shrinking feature widths of patterned photoresist layers in a more economical way than may be associated with for example strong PSM.

SUMMARY OF THE INVENTION

The present invention addresses these needs by providing methods of patterning photoresist layers by trimming for example sidewalls of select photoresist features. In accordance with one aspect of the present invention, a method of forming a feature pattern in a photosensitive layer comprises forming the photosensitive layer on a substrate, providing a first mask having a first opaque area thereon, and performing a first exposure process with a first dose to form a first unexposed image in the photosensitive layer. The method further comprises performing a second exposure process with a second dose to expose sidewalls of the first unexposed image so that the sidewalls of the first unexposed image receive at least a portion of the second dose thus forming a second unexposed image in the photosensitive layer, and developing the photosensitive layer with a developing process to form the feature pattern and to create features having smaller widths than those which would result in developing the photosensitive layer of the first unexposed image.

The present invention may be able to select the patterns for shrinkage and to provide cost-effective means for printing features having reduced dimensions. In certain embodiments, either binary masks or half-tone phase-shift masks (HTPSMs) may be implemented in combination with various features of the present invention. The first and second exposures can be performed using relatively inexpensive masks, while at the same time reductions in pattern dimension can be obtained. In accordance with one aspect of the invention, the second exposure can be performed with a patternless mask, thus attenuating overlay problems while at the same time obtaining reductions in pattern dimension. In accordance with another aspect of the invention, the second exposure can be performed without a mask, thus attenuating overlay problems while obtaining reductions in pattern dimension. In accordance with yet another aspect of the invention, the second exposure can be performed with the first mask, thus obtaining reductions in pattern dimension while attenuating overlay problems.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention.

BRIEF DESCIRPTION OF THE FIGURES

DETAILED DESCRIPTION OF THE PRESENTLY PREFERRED EMBODIMENTS

Figure 1A:
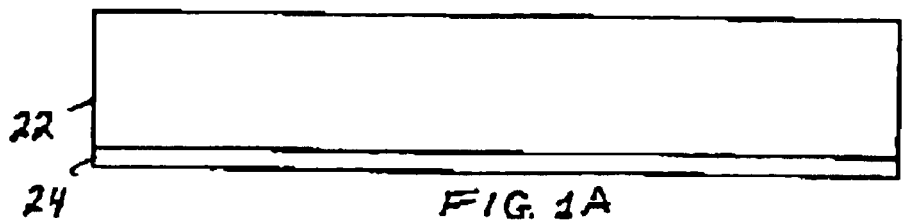
FIGS. 1A–1D are cross-sectional views of a semiconductor profile depicting process steps in accordance with a first illustrated embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of semiconductor devices. The present invention may be practiced in conjunction with various semiconductor process techniques that are conventionally used in the art, and only so much of the commonly practiced process steps are included herein as are necessary to provide an understanding of the present invention. The present invention has applicability in the field of photolithography in general. For illustrative purposes, however, the following description pertains to trimming the sidewalls of previously developed photoresist.

Referring more particularly to the drawings, FIGS. 1A–1D show a semiconductor process in accordance with a first embodiment of the present invention. In FIG. 1A a photosensitive layer 22 is shown formed on a substrate 24. As with the below-described embodiments, the photosensitive layer may comprise a single photosensitive layer or multiple layers. Since in the illustrated embodiment the photosensitive layer 22 is a negative photoresist, portions of the photosensitive layer 22 that are exposed to a threshold amount of radiation will be sufficiently cross-linked or polymerized to remain after development, while unexposed portions of the photosensitive layer 22 will be removed during development.

Figure 1B:
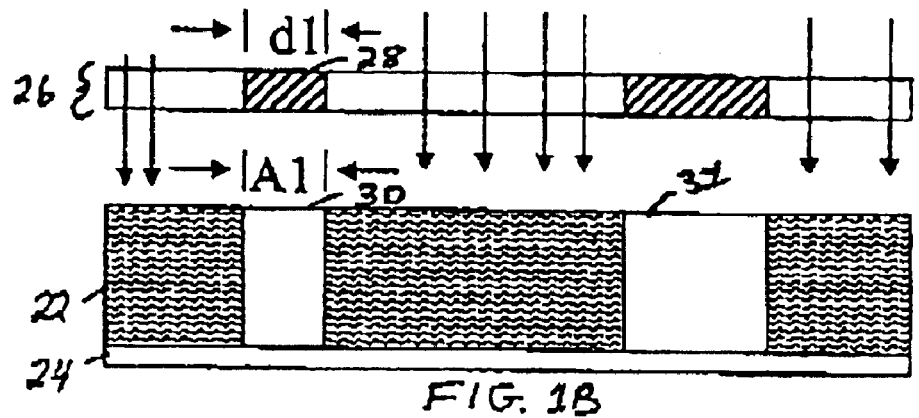

FIG. 1B shows a first exposure process with a first mask 26. The first mask 26 has a first opaque area 28 with a first dimension d1. The first mask 26 is transparent but for the shaded regions shown in the figure. As with the below-described embodiments, the first opaque area may comprise a single opaque block or a plurality of opaque blocks. FIG. 1B also shows a first unexposed image 30 and another unexposed image 31 formed in the photosensitive layer 22. In a first exposure process, the first mask 26 is illuminated with a first dose of ultraviolet light (or other radiation) perpendicularly to an upper surface of the first mask 26. The first exposure process is performed with a first dose of ultraviolet light on the photosensitive layer 22, wherein the regions shaded by the opaque areas of the first mask 26 are not exposed. This first exposure process yields the first unexposed image 30, having a dimension A1, in the photosensitive layer 22. As with the below-described embodiments, the exposure process may comprise at least one of an axis illumination and an off-axis illumination. As used herein, the term "unexposed image" refers to a portion of the photosensitive layer that has been shielded from radiation by, for example, the opaque area 28 of the first mask 26.

Figure 1C:
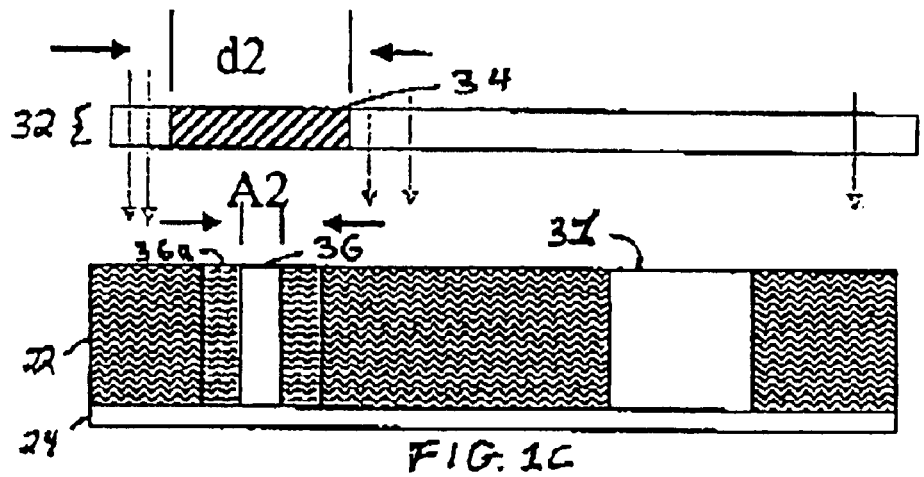

FIG. 1C shows a second exposure process with a second mask 32. The second mask 32 has a second opaque area 34 with a dimension d2, which with respect to FIG. 1B is larger than the dimension d1 of the first opaque area 28. As with the below-described embodiments, the second opaque area may comprise a single opaque block or a plurality of opaque blocks. Also, in various implementations of the present embodiments, the first opaque area and the second opaque area may be disposed on the same mask or on different masks. Moreover, in the present and below-described embodiments, the first and/or second masks may comprise the same or different materials in the form of, for example, at least one of a binary mask, a phase shift mask, and a chromeless (without coloration) mask, and furthermore the first and second exposures may be performed using at least one of a projection exposure tool and a contact printing tool. As shown, the second opaque area 34 is aligned to shield a central region of the first unexposed image 30 and to be transparent elsewhere. In the illustrated embodiment, the dimension d2 is greater than the dimension d1 in regions in which sidewalls of an unexposed image are to be reduced, while unexposed images not to be further reduced such as the unexposed image 31 are aligned with transparent regions of the second mask 32. The second exposure process is performed with a second dose of ultraviolet light (or other radiation) to expose sidewalls 36a of the first unexposed image 30 (FIG. 1B). In addition to having previously received relatively small portions of the first dose during the first exposure, the sidewalls 36a now receive portions of the second dose, thus receiving a cumulative dose of radiation. In accordance with an aspect of the present invention, this cumulative dose of radiation on the sidewalls exceeds a threshold of the ensuing developing process. Consequently, the second exposure process yields a second unexposed image 36 in the photosensitive layer 22, whereby as a consequence of diffraction during the second exposure process the second unexposed image 36 has a dimension A2 that is smaller than a corresponding dimension A1 of the first unexposed image 30.

As with the below-described embodiments, in accordance with one aspect of the present invention the cumulative dose of radiation on the sidewalls is engineered to exceed a threshold of the ensuing developing process. This engineering of doses may comprise various permutations including reversing the order of the first exposure process and the second exposure process, and selecting a first dose that is greater than, less than, or equal to the second dose.

Figure 1D:
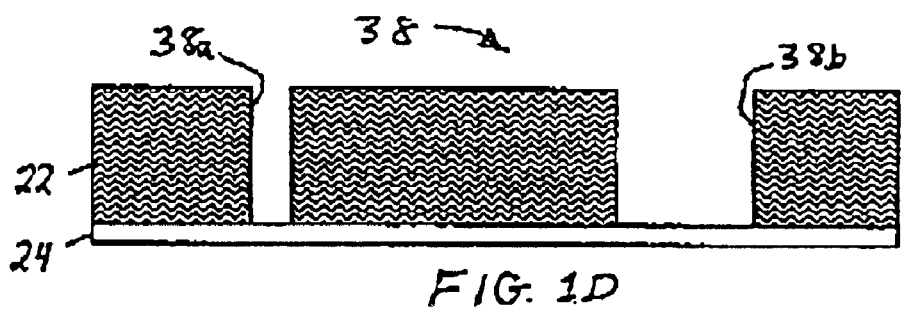

FIG. 1D shows a feature pattern 38 in which the photosensitive layer 22 has been developed. The regions that were exposed during at least one of the two exposure processes beyond the threshold of the developing process remain after development. Developing the second unexposed image 36 forms a feature pattern 38a, and developing the unexposed image 31 forms a feature pattern 38b. Selected final features, e.g., feature pattern 38a, have smaller widths than those resulting in developing the photosensitive layer of the first unexposed image 30.

Figure 2A:
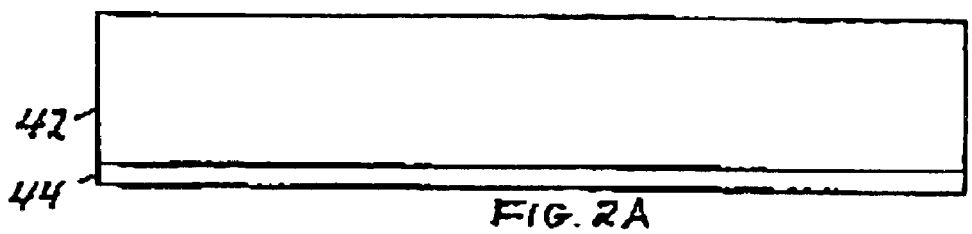
FIGS. 2A–2D are cross-sectional views of a semiconductor profile depicting process steps in accordance with a second illustrated embodiment of the present invention.

FIGS. 2A–2D show a semiconductor process in accordance with a second embodiment of the present invention, wherein as depicted in FIG. 2A a photosensitive layer 42 is initially formed on a substrate 44. Since the photosensitive layer 42 in this embodiment is a positive photoresist, portions of the photosensitive layer 42 that are exposed to a threshold amount of radiation will be sufficiently dissociated or depolymerized to be removed during development, while portions of the photosensitive layer 42 that do not receive the threshold amount of exposure will remain after development.

Figure 2B:
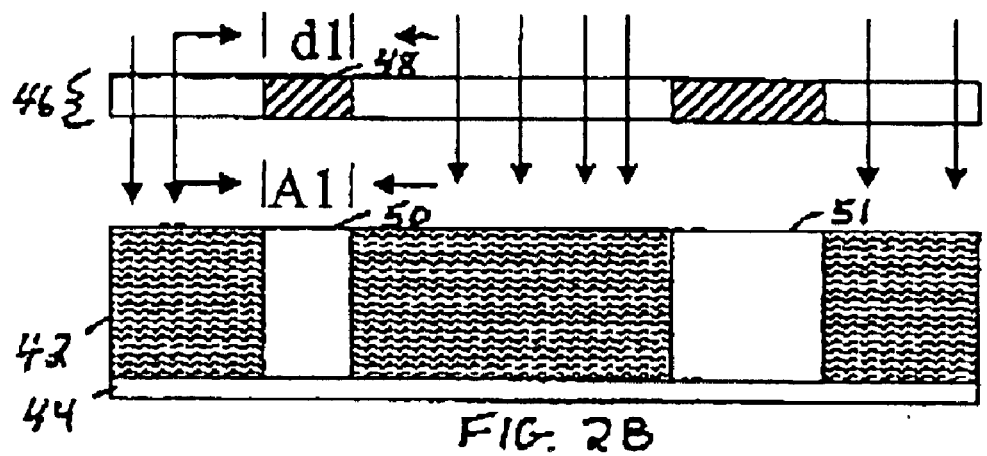

FIG. 2B shows a first exposure process with a first mask 46. The first mask 46 has a first opaque area 48 with a first dimension d1. The first mask 46 is transparent but for the shaded regions shown in the figure. FIG. 2B also shows a first unexposed image 50 and another unexposed image 51 formed in the photosensitive layer 42. The first exposure process is performed with a first dose of ultraviolet light (or other radiation) on the photosensitive layer 42, wherein the regions shaded by the opaque areas of the first mask 46 are not exposed. The first exposure process results in the first unexposed image 50 having a dimension A1 in the photosensitive layer 42.

Figure 2C:
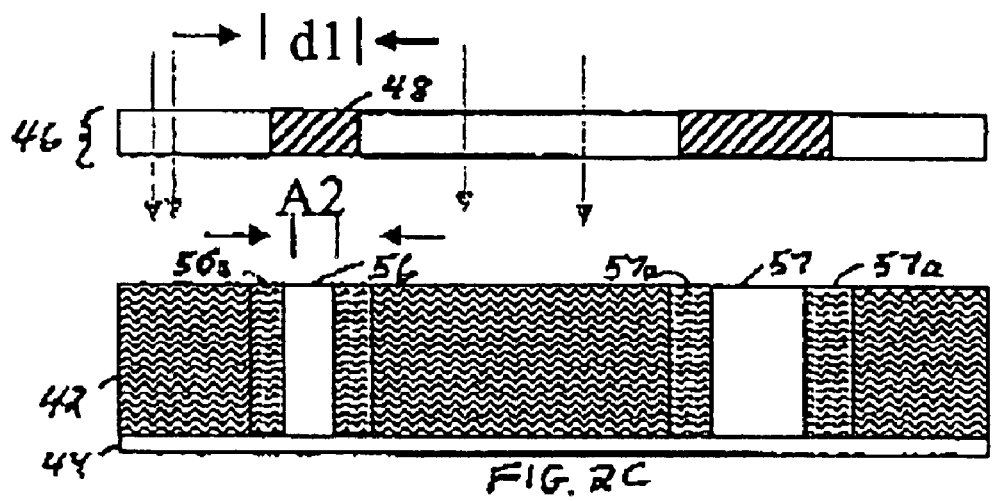

FIG. 2C shows a second exposure process with the first mask 46 or, alternatively, with a second mask having a pattern functionally equivalent to that of the first mask 46. The second exposure process is performed with a second dose of ultraviolet light (or other radiation) to expose sidewalls 56a of the first unexposed image 50 (FIG. 2B). In addition to having previously received relatively small portions of the first dose during the first exposure, the sidewalls 56a now receive portions of the second dose, thus acquiring a cumulative dose of radiation. In accordance with an aspect of the present invention, this cumulative dose of radiation on the sidewalls can be engineered to exceed a threshold of the ensuing developing process. Consequently, the second exposure process yields a second unexposed image 56 in the photosensitive layer 42, whereby as a consequence of diffraction during the second exposure process the second unexposed image 56 has a dimension A2 which is smaller than a corresponding dimension A1 of the first unexposed image 50.

Figure 2D:
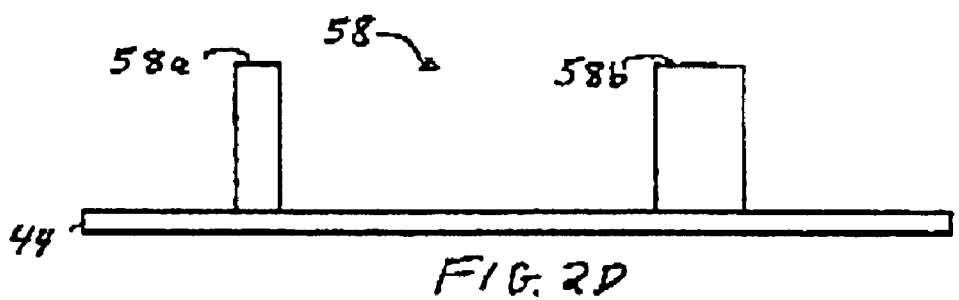

FIG. 2D shows a feature pattern 58 in which the photosensitive layer 42 is developed. The regions that were not exposed beyond a threshold level during the two exposure processes remain after development. Developing the second unexposed image 56 forms a feature pattern 58a, and developing the unexposed image 51 forms a feature pattern 58b. The feature patterns 58a and 58b have smaller widths than those that would have resulted in developing of the photosensitive layer of the first unexposed images 50 and 51, respectively.

Figure 3A:
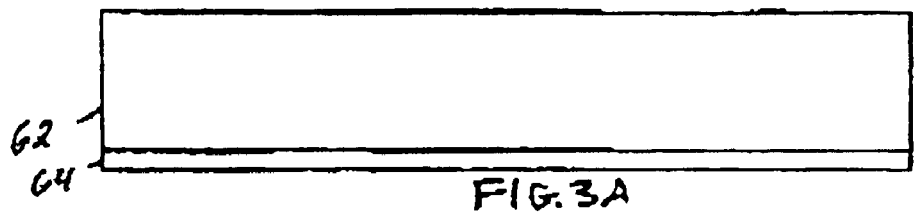
FIGS. 3A–3D are cross-sectional views of a semiconductor profile depicting process steps in accordance with a third illustrated embodiment of the present invention.
Figure 3B:
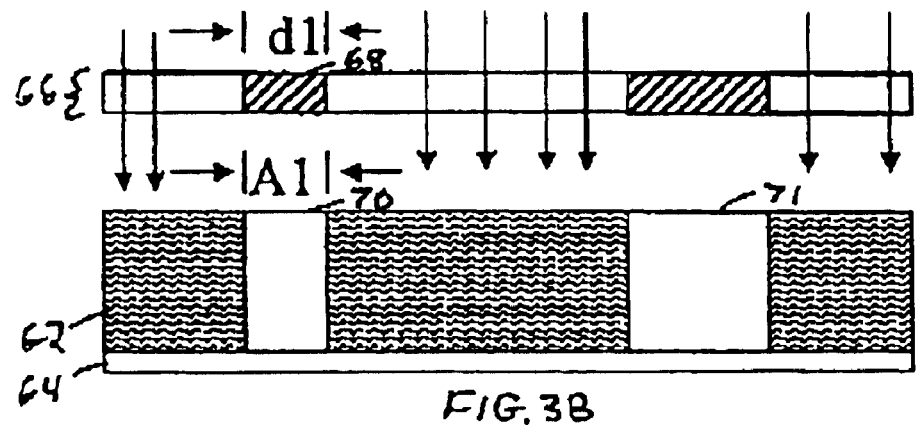

FIGS. 3A–3D show a semiconductor process in accordance with a third embodiment of the present invention. Initially, as depicted in FIG. 3A, a positive photosensitive layer 62 is formed over a substrate 64. FIG. 3B shows a first exposure process with a first mask 66. The first mask 66 comprises a first opaque area 68 with a first dimension d1, and is transparent but for the shaded regions shown in the figure. The first exposure process is performed with a first dose of ultraviolet light (or other radiation) on the photosensitive layer 62, wherein the regions shaded by the opaque areas of the first mask 66 are not exposed. A first unexposed image 70 and another unexposed image 71 are formed in the photosensitive layer 62, wherein the first unexposed image 70 has a dimension A1.

Figure 3C:
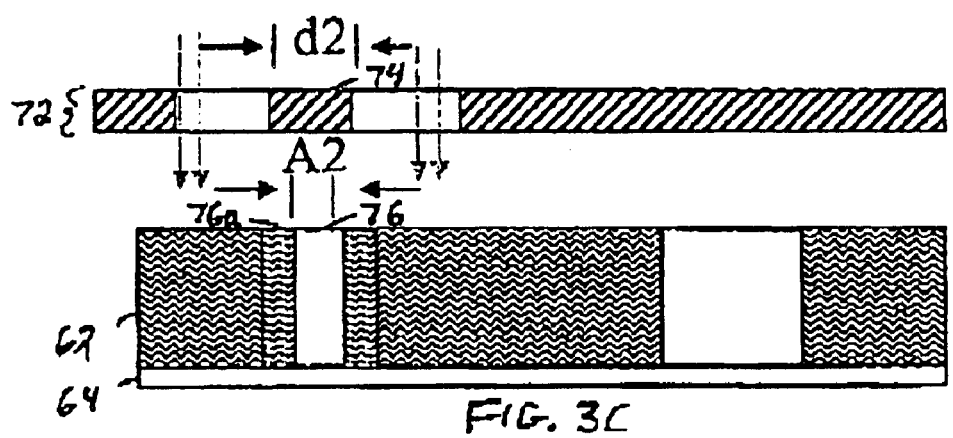
Figure 3D:
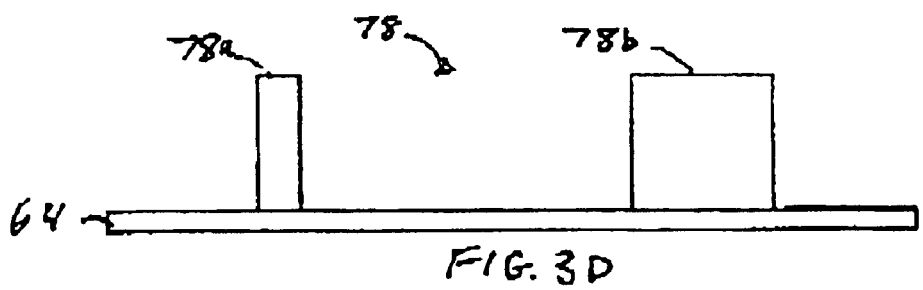

FIG. 3C shows a second exposure process with a second mask 72. The second mask 72 has for example a second opaque area 74 with a dimension d2. Regarding the opaque area 74, the second mask 72 is identical to the first mask 66 near the feature to be reduced but is opaque elsewhere. In other words, the dimension d2 equals the dimension d1 in those regions in which final features are to be slimmed or reduced, but the second mask 72 contains additional opaque blocks that will not expose the features that are not to be reduced. The second exposure process is performed with a second dose of ultraviolet light (or other radiation) to expose sidewalls 76a of the first unexposed image 70 (FIG. 3B). In addition to having previously received relatively small portions of the first dose during the first exposure, the sidewalls 76a now receive portions of the second dose, thus receiving a cumulative dose of radiation. In accordance with an aspect of the present invention, this cumulative dose of radiation on the sidewalls is engineered to exceed a threshold of the ensuing developing process. Consequently, the second exposure process yields a second unexposed image 76 in the photosensitive layer 62, whereby as a consequence of diffraction during the second exposure process the second unexposed image 76 has a dimension A2 that is smaller than a corresponding dimension A1 of the first unexposed image 70. As with the embodiments of FIGS. 4 and 5, the transparent slits adjacent to and defining the second opaque area, e.g., 74, may enhance the diffraction during the second exposure process, thus potentially providing an additional image dimension reduction. FIG. 3D shows a feature pattern 78 in which the photosensitive layer 62 has been developed. Regions which were not exposed during the prior exposure processes beyond a threshold level of the developing process remain after development. Developing of the second unexposed image 76 forms a feature pattern 78a, and developing of the unexposed image 71 forms a feature pattern 78b. Selected final features, e.g., feature pattern 78a, have smaller widths than those which would have resulted in developing the photosensitive layer of the first unexposed image 70.

Figure 4A:
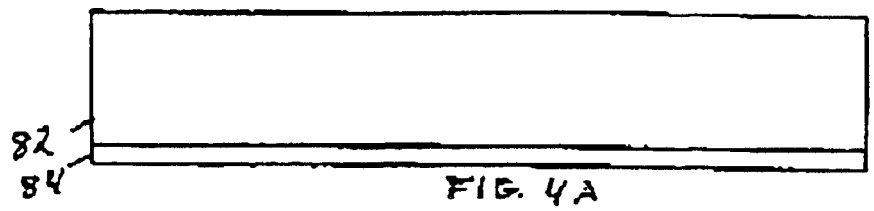
FIGS. 4A–4D are cross-sectional views of a semiconductor profile depicting process steps in accordance with a fourth illustrated embodiment of the present invention.
Figure 4B:
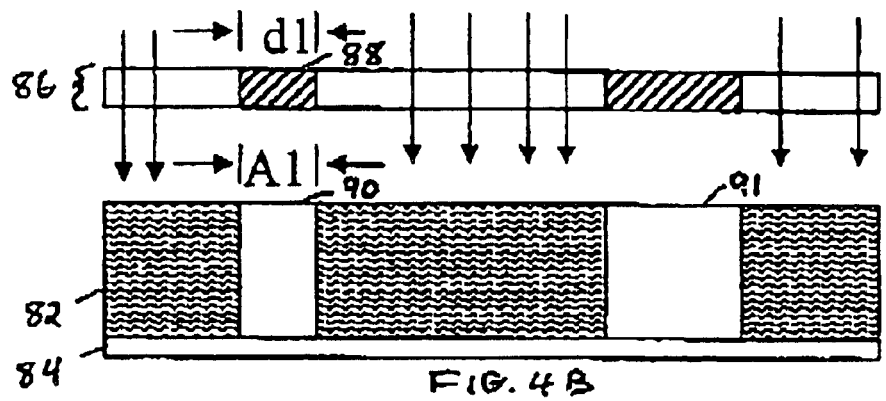

FIGS. 4A–4D show a semiconductor process in accordance with a fourth embodiment of the present invention, wherein a positive photosensitive layer 82 is initially formed on a substrate 84 as depicted in FIG. 4A. FIG. 4B shows a first exposure process with a first mask 86 having a first opaque area 88 with a first dimension d1. The first mask 86 is transparent but for the shaded regions shown in the figure. The first exposure process is performed with a first dose of ultraviolet light (or other radiation) on the photosensitive layer 82, wherein the regions shaded by the opaque areas of the first mask 86 are not exposed. This first exposure process yields a first unexposed image 90, having a dimension A1, and also yields a second unexposed image 91 in the photosensitive layer 82.

Figure 4C:
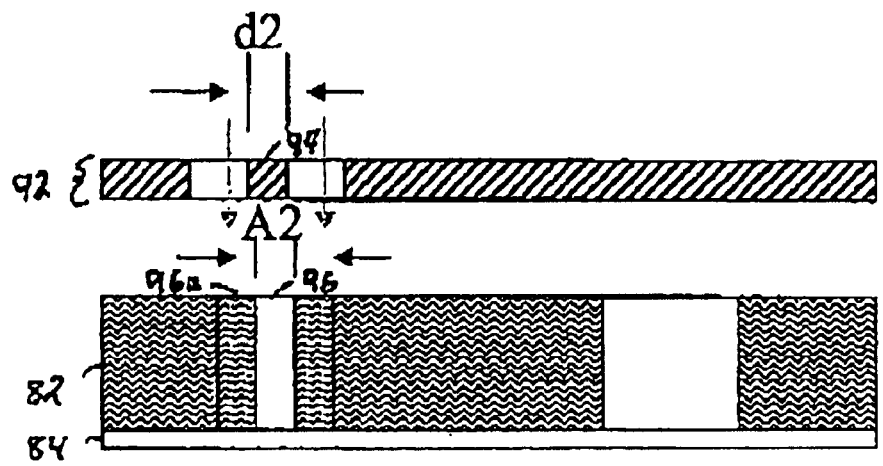

FIG. 4C shows a second exposure process with a second mask 92. The second mask 92 has a second opaque area 94 with a dimension d2, which with respect to FIG. 4B is smaller than the dimension d1 of the first opaque area 88. Openings adjacent to second opaque area 94 are aligned near the sidewalls of the feature to be reduced, while the mask is opaque elsewhere. The dimension d2 is thus smaller than the dimension d1 in those regions in which final features are to be reduced, and the second mask 92 contains additional opaque blocks that will not expose the features that are not to be reduced. The second exposure process is performed with a second dose of ultraviolet light (or other radiation) to expose sidewalls 96a of the first unexposed image 90 (FIG. 4B). In addition to having previously received amounts of the first dose during the first exposure, the sidewalls 96a now receive amounts of the second dose, thus receiving a cumulative dose of radiation that is engineered to exceed a threshold of the ensuing developing process. Consequently, the second exposure process yields a second unexposed image 96 in the photosensitive layer 82, whereby as a consequence of diffraction during the second exposure process the second unexposed image 96 has a dimension A2 which is smaller than a corresponding dimension A1 of the first unexposed image 90.

Figure 4D:
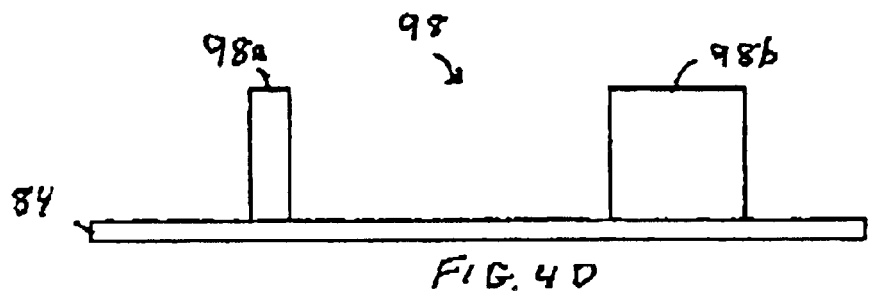

FIG. 4D shows a feature pattern 98 following development of the photosensitive layer, wherein regions that were not exposed beyond a threshold level during the two exposure processes remain after the development. Developing the second unexposed image 96 forms a feature pattern 98a, and developing the unexposed image 91 forms a feature pattern 98b. The final feature pattern 98a has a smaller width than that which would result in developing of the photosensitive layer of the first unexposed image 90.

FIGS. 5A–5D show a semiconductor process in accordance with a fifth embodiment of the present invention, wherein a photosensitive layer 102 is disposed over a substrate 104. Since in the illustrated embodiment the photosensitive layer 102 is a positive photoresist, portions of the photosensitive layer 102 that receive a threshold level of radiation will be depolymerized and then removed during development, while other portions of the photosensitive layer 102 will remain after development.

Figure 5A:
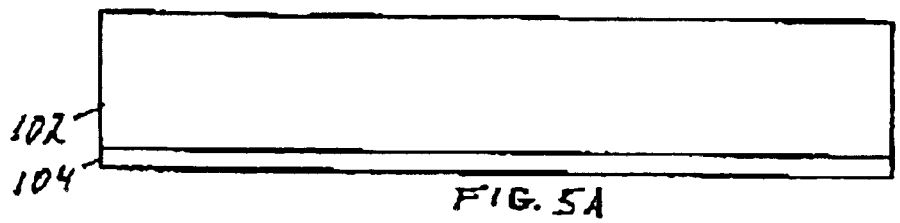
FIGS. 5A–5D are cross-sectional views of a semiconductor profile depicting process steps in accordance with a fifth illustrated embodiment of the present invention.
Figure 5B:
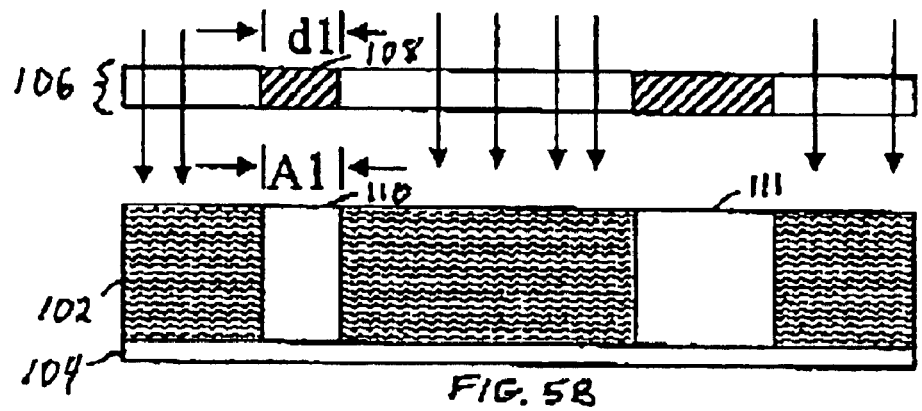

FIG. 5B shows a first exposure process with a first mask 106 having a first opaque area 108 with a first dimension d1. FIG. 5B also shows a first unexposed image 110 and another unexposed image 111 formed in the photosensitive layer 102. The first exposure process is performed with a first dose of ultraviolet light (or other radiation) on the photosensitive layer 102, wherein regions shaded by opaque areas of the first mask 106 are not exposed. The first exposure process yields the first unexposed image 110 in the photosensitive layer 102 wherein the first unexposed image has a dimension A1.

Figure 5C:
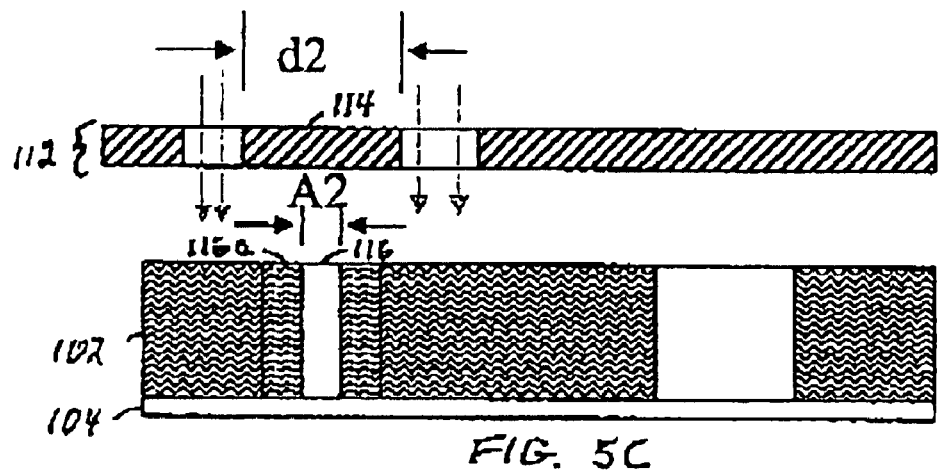

FIG. 5C shows a second exposure process with a second mask 112. The second mask 112 has a second opaque area 114 with a dimension d2, which with respect to FIG. 5B is larger than the dimension d1 of the first opaque area 108. Transparent regions adjacent to the second opaque area 114 are aligned in a vicinity above the sidewalls of the feature(s) to be reduced, while additional opaque blocks of the second mask 112 will not expose features that are not to be reduced. The second exposure process is performed with a second dose of ultraviolet light (or other radiation) to expose sidewalls 116a of the first unexposed image 110 (FIG. 5B). In addition to portions of the first dose received during the first exposure, the sidewalls 116a now receive portions of the second dose, for a net dose of radiation. In accordance with an aspect of the present invention, this net dose of radiation on the sidewalls exceeds a threshold of the ensuing developing process. Consequently, the second exposure process yields a second unexposed image 116 in the photosensitive layer 22. As a consequence of reception of radiation from the first exposure and the second exposure, either or both having resulted at least in part from diffraction, the second unexposed image 116 has a dimension A2 which is smaller than a corresponding dimension A1 of the first unexposed image 110. A preferred illumination condition for resolving isolated 100 nm lines involves two exposures, each with a numerical aperture (NA) of 0.6 and sigma of 0.6. A preferred mask bias for resolving an isolated 100 nm line formation is 0.02 um wherein the dimension d1 of the first opaque area 108 is 0.28 um and the dimension d2 of the second opaque area 114 is 0.30 um.

Figure 5D:
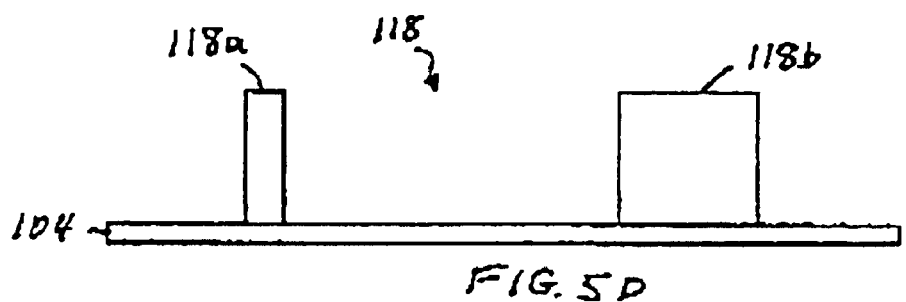
Figure 6A:
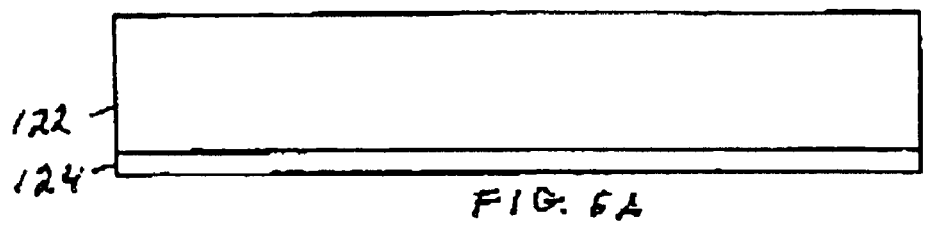
FIGS. 6A–6D are cross-sectional views of a semiconductor profile depicting process steps in accordance with a sixth illustrated embodiment of the present invention.
Figure 6B:
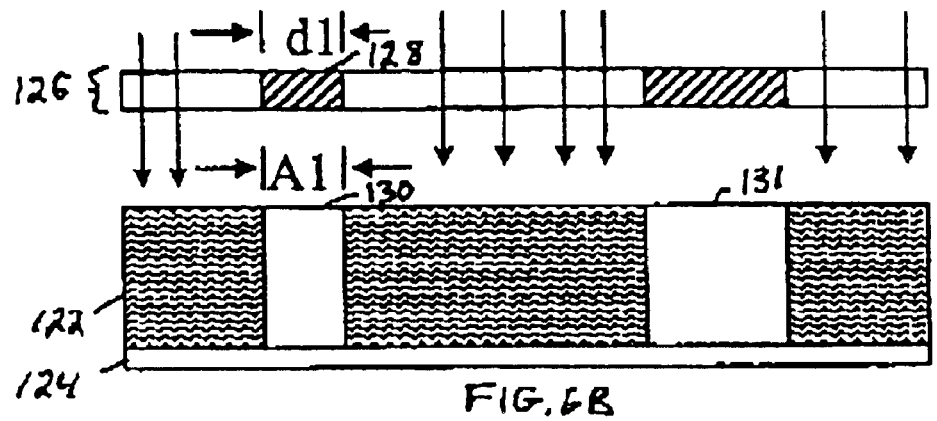
Figure 6C:
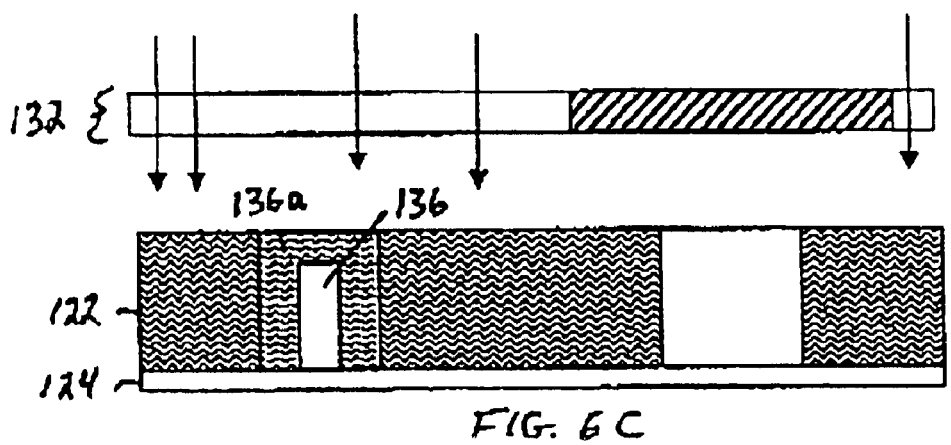
Figure 9A:
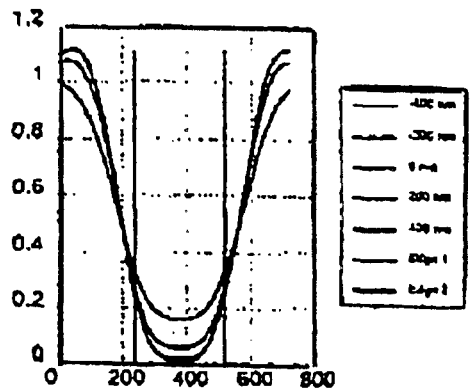
FIGS. 9A–9C are data from split lots with masks of different constructions in accordance with the fifth illustrated embodiment of the present invention.
Figure 9B:
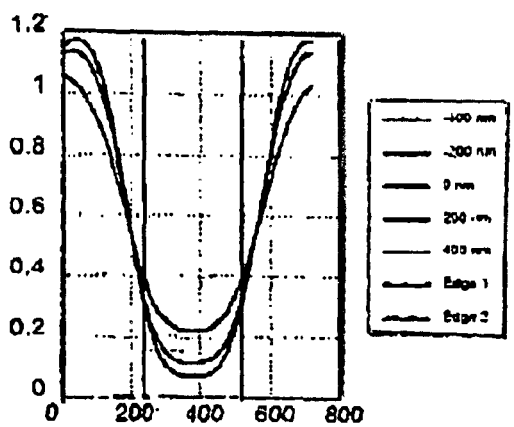
Figure 9C:
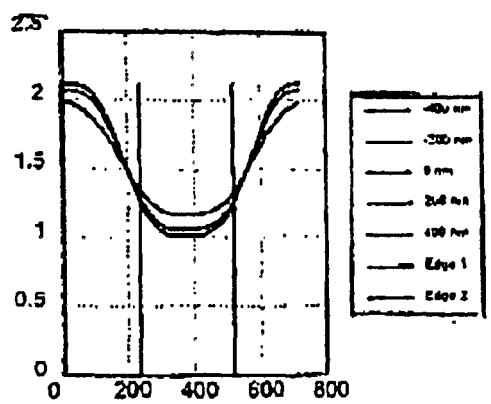

The photosensitive layer 102 is then developed to yield a feature pattern 118 as shown in FIG. 5D. Regions that were not exposed during both of the two exposure processes beyond the threshold of the developing process remain after development. Developing the second unexposed image 116 forms a feature pattern 118a, and developing the unexposed image 111 forms a feature pattern 118b wherein the feature pattern 118a has a smaller width than that which would result from developing the photosensitive layer of the first unexposed image 110. In accordance with one implementation, split lots with isolated 100 nm lines, as reflected in the data of FIGS. 9A–9C, show that image contrast improves when both the first mask 106 and the second mask 112 comprise binary masks as shown in FIG. 9A, versus when a binary mask is used for the first mask 106 and a phase shift mask is used for the second mask as shown in FIG. 9B. Moreover, the image contrast of FIG. 9A is better than an implementation wherein a binary mask is used for the first mask 106 and a chromeless mask, or no mask, is used for the second exposure as shown in FIG. 9C. The implementation of a binary mask for the first exposure, corresponding to the data of FIGS. 9A–9C, can provide better results than implementations wherein the first exposure is performed with either a phase shift mask or with a chromeless mask or no mask FIGS. 6A–6D show a semiconductor process in accordance with a sixth embodiment of the present invention. FIG. 6A depicts a positive photosensitive layer 122 formed on a substrate 124, and FIG. 6B shows a first exposure process with a first mask 126. The first mask 126 has a first opaque area 128 with a first dimension d1, whereby the first mask 126 is transparent but for the shaded regions shown in the figure. FIG. 6B also shows a first unexposed image 130 and another unexposed image 131 formed in the photosensitive layer 122. The first exposure process is performed with a first dose of ultraviolet light (or other radiation) on the photosensitive layer 122, wherein regions shaded by the opaque areas of the first mask 126 are not exposed, resulting in the first unexposed image 130 having a dimension A1 in the photosensitive layer 122. FIG. 6C shows a second exposure process with a second mask 132 with at least one patternless area. In particular, the second mask 132 has no second opaque area corresponding to the first opaque area 128 but rather is transparent near that area. The second mask 132 is thus transparent in those regions in which final features are to be reduced, but may in certain embodiments be opaque elsewhere. The second exposure process is performed with a second dose of ultraviolet light (or other radiation) to expose sidewall and top portions 136a of the first unexposed image 130 (FIG. 6B). In addition to having previously received relatively small amounts of the first dose during the first exposure, the sidewall and top portions 136a now receive amounts of the second dose, thus receiving a cumulative dose of radiation. This cumulative dose of radiation on the sidewalls and/or top portions can be engineered to exceed a threshold of the ensuing developing process. Consequently, the second exposure process yields a second unexposed image 136 in the photosensitive layer 122, whereby as a consequence of diffraction the second unexposed image 136 has a dimension A2 that is smaller than a corresponding dimension A1 of the first unexposed image 30.

Figure 6D:
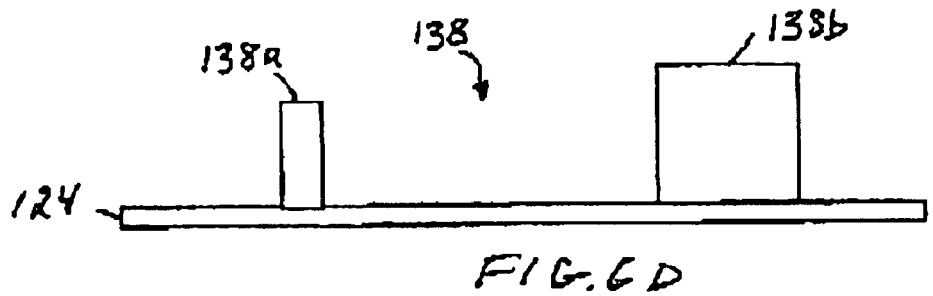

FIG. 6D shows a feature pattern 138 in which following development of the photosensitive layer regions that were not exposed beyond a threshold level during the two exposure processes remain. Developing the second unexposed image 136 forms a feature pattern 138a, and developing the unexposed image 131 forms a feature pattern 138b. Selected final features, e.g., feature pattern 138a, have a smaller width and are shorter than those resulting from developing the photosensitive layer of the first unexposed image 130.

Figure 7A:
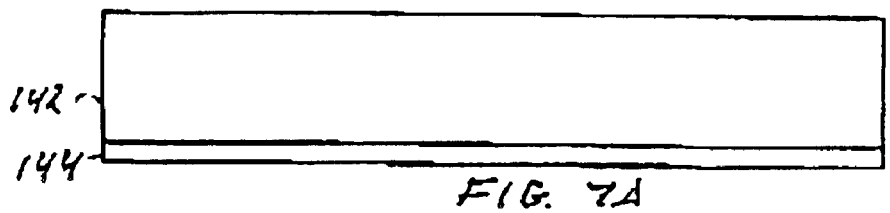
FIGS. 7A–7D are cross-sectional views of a semiconductor profile depicting process steps in accordance with a seventh illustrated embodiment of the present invention.

FIGS. 7A–7D show a semiconductor process in accordance with a seventh embodiment of the present invention, wherein at an early stage a photosensitive layer 142 is formed on a substrate 144 as depicted in FIG. 7A. Since in the illustrated embodiment the photosensitive layer 142 is a positive photoresist, exposed portions of the photosensitive layer 142 will be depolymerized and then removed during development, while unexposed portions of the photosensitive layer 142 will remain after development.

Figure 7B:
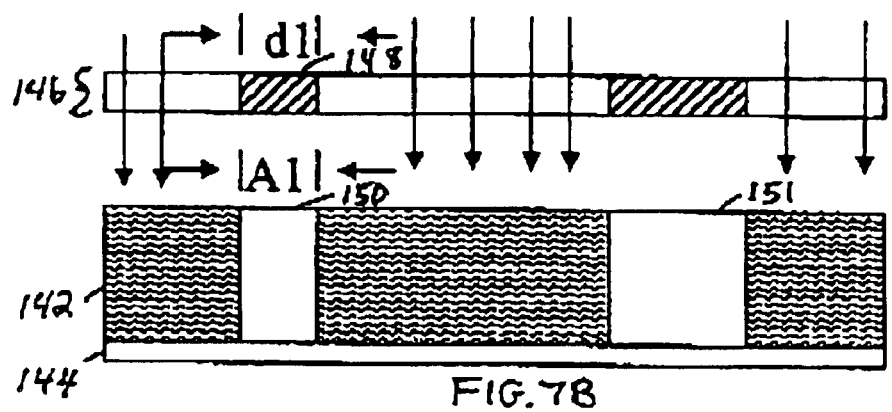

FIG. 7B shows a first exposure process with a first mask 146. The first mask 146 has a first opaque area 148 with a first dimension d1. The first mask 146 is transparent but for the shaded regions shown in the figure. FIG. 7B also shows a first unexposed image 150 and another unexposed image 151 formed in the photosensitive layer 142. The first exposure process is performed with a first dose of ultraviolet light (or other radiation) on the photosensitive layer 142, wherein the regions shaded by the opaque areas of the first mask are not exposed beyond a threshold level of an ensuing development process. The first exposure process yields the first unexposed image 150 with a dimension A1 in the photosensitive layer.

Figure 7C:
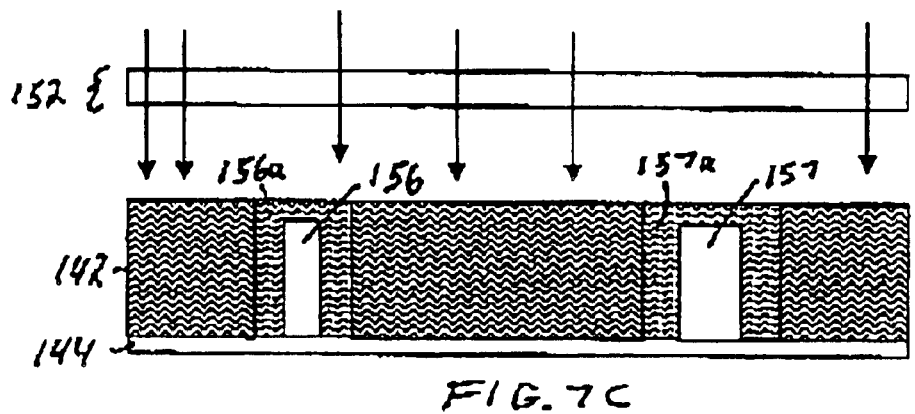
Figure 7D:
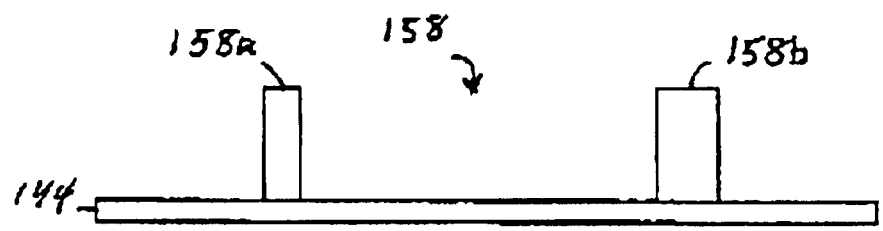

FIG. 7C shows a second exposure process with a second mask 152. Being chromeless, the second mask 152 is without pattern, and is completely transparent in the areas of interest. Light may therefore pass through the second mask 152 without substantial alteration. The second exposure process is performed with a second dose of ultraviolet light (or other radiation) to expose sidewall and top portions 156a of the first unexposed image 150 of FIG. 7B. In addition to having previously received relatively small amounts of the first dose, the sidewall and top portions 156a now receive amounts of the second dose, thus receiving a net dose of radiation that exceeds a threshold of the ensuing developing process. Consequently, the second exposure process yields a second unexposed image 156 in the photosensitive layer 142, whereby as a consequence of diffraction during the second exposure process the second unexposed image 156 has a width that is smaller than a corresponding dimension A1 of the first unexposed image 150. FIG. 7D shows a feature pattern 158 in which the photosensitive layer 142 has been developed. The regions that were not exposed during the exposure processes beyond the threshold of the developing process remain after development. Developing the second unexposed image 156 forms a feature pattern 158a, and developing the unexposed image 151 forms a feature pattern 158b. The feature patterns 158a and 158b have smaller widths and heights than those which would have resulted from developing the photosensitive layer of the first unexposed images 150 and 151.

Figure 8A:
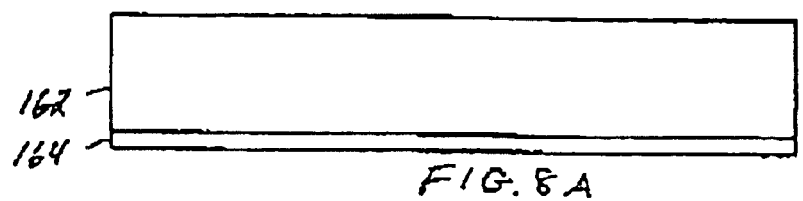
FIGS. 8A–8D are cross-sectional views of a semiconductor profile depicting process steps in accordance with an eighth illustrated embodiment of the present invention.
Figure 8B:
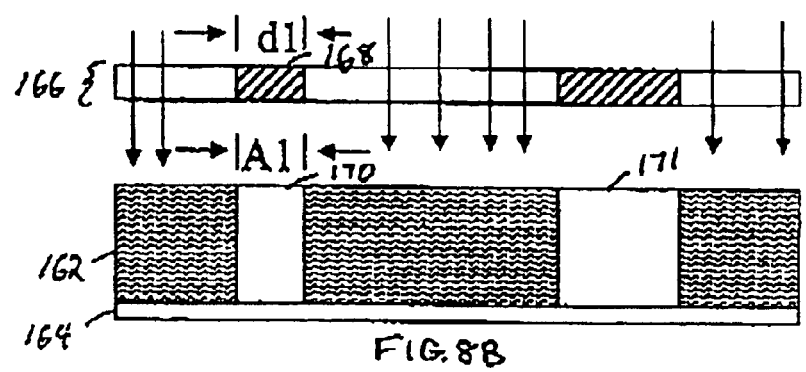
Figure 8C:
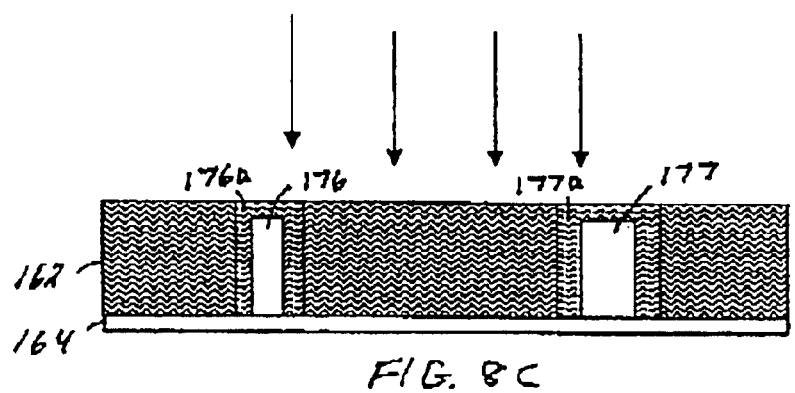

FIGS. 8A–8D show a semiconductor process in accordance with an eighth embodiment of the present invention. At an early step in the process, a positive photosensitive layer 162 is formed over a substrate 164 as shown in FIG. 8A. Since in the illustrated embodiment the photosensitive layer 162 is a positive photoresist, exposed portions of the photosensitive layer 162 will be depolymerized and then removed during development, while unexposed portions of the photosensitive layer 162 will remain after development. FIG. 8B shows a first exposure process with a first mask 166 having a first opaque area 168 with a first dimension d1. The first mask 166 is transparent but for the shaded regions shown in the figure. The first exposure process is performed with a first dose of ultraviolet light (or other radiation) on the photosensitive layer 162, wherein the regions shaded by the opaque areas of the first mask are not exposed. This first exposure process results in for example the first unexposed image 170 with a dimension A1 and another unexposed image 171 formed in the photosensitive layer 162. FIG. 8C shows a second exposure process that is maskless; that is, the second exposure is performed without a mask. The second exposure process is performed with a second dose of ultraviolet light (or other radiation) to expose sidewall and top portions 176 of the first unexposed image 170. In addition to having previously received amounts of the first dose during the first exposure, the sidewall and top portions 176a now receive amounts of the second dose, for a cumulative dose of radiation. In accordance with an aspect of the present invention, this cumulative dose is engineered to exceed a threshold of the ensuing developing process. Accordingly, the second exposure process yields a second unexposed image 176 in the photosensitive layer 162, whereby as a consequence of diffraction during the second exposure process the second unexposed image 176 has a dimension that is smaller than a corresponding dimension A1 of the first unexposed image 170.

Figure 8D:
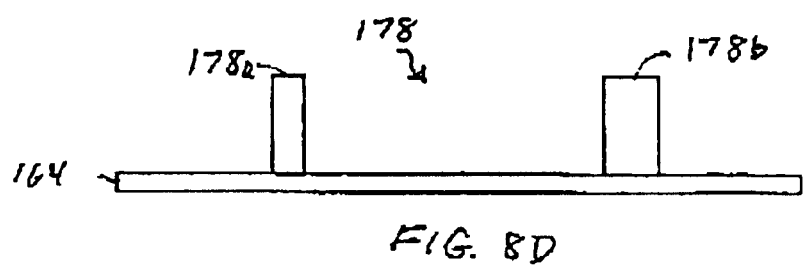

FIG. 8D shows a feature pattern 178 in which following development of the photosensitive layer 162 regions that were not exposed beyond a threshold level during the first and second exposure processes remain after development. Developing the second unexposed image 176 forms a feature pattern 178a, and developing the unexposed image 171 forms a feature pattern 178b. The feature patterns 178a and 178b have smaller widths and are shorter than those which would have resulted from developing the photosensitive layer 162 of the first unexposed images 170 and 171.

In view of the foregoing, it will be understood by those skilled in the art that the methods of the present invention can facilitate formation of patterned photoresist, and in particular fine line printing. The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, although only one negative photoresist example has been provided other implementations using negative photoresist will be apparent to those skilled in the art in view of the disclosure herein including the various examples provided in the context of positive photoresist implementations. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of forming a feature pattern in a photosensitive layer, comprising:

forming the photosensitive layer on a substrate;

providing a first mask having a first opaque area thereon;

performing a first exposure process with a first dose using the first mask as a photo-mask to form a first unexposed image, which defines a predetermined number of features in the photosensitive layer;

performing a second exposure process with a second dose to expose sidewalls of the features of the first unexposed image, wherein a second unexposed image is formed in the photosensitive layer; and developing the photosensitive layer with a development process to form the feature pattern and to define the features apart from at least portions of the exposed sidewalls, to thereby create slim features corresponding to the predetermined number and having smaller widths than widths of the features which would result in developing the photosensitive layer of the first unexposed image.

2. The method as set forth in claim 1, wherein:

during the first exposure sidewalls of the first unexposed image receive at least a portion of the first dose; and during the second exposure sidewalls of the first unexposed image in addition to having received at least a portion of the first dose also receive at least a portion of the second dose.

3. The method as set forth in claim 2, wherein:

at least one sidewall receives an amount of the first dose which is below a threshold level required for formation of a corresponding one of the slim features, but receives an amount of the second dose to raise a cumulative exposure thereof above the threshold level so that during the development process a corresponding slim feature is formed.

4. The method as set forth in claim 3, wherein the at least one sidewall comprises a plurality of sidewalls; and the correspond slim feature comprises a plurality of slim features.

5. The method as set forth in claim 2, wherein the second dose is equal to the first dose.

6. The method as set forth in claim 2, wherein the second dose is not equal to the first dose.

7. The method as set forth in claim 2, wherein the second exposure is performed using a pattern equivalent to that of the first mask.

8. The method as set forth in claim 2, wherein the second exposure is performed using the first mask.

9. The method as set forth in claim 2, wherein the second exposure uses a mask with a plurality of patternless areas.

10. The method as set forth in claim 2, wherein the second exposure uses a mask without a pattern.

11. The method as set forth in claim 2, wherein the second exposure is performed without a mask.

12. The method as set forth in claim 2, wherein the first opaque area has a first dimension d1; and the performing of the second exposure process is preceded by providing a second mask having a second opaque area thereon, the second opaque area having a second dimension d2.

13. The method as set forth in claim 12, wherein:

during the first exposure sidewalls of the first unexposed image receive at least a portion of the first dose;

during the second exposure sidewalls of the first unexposed image in addition to having received at least a portion of the first dose also receive at least a portion of the second dose; and at least one of the sidewalls receives an amount of the first dose which is below a threshold level required for formation of a corresponding one of the slim features, but receives an amount of the second dose to raise a cumulative exposure thereof above the threshold level so that during the development process a corresponding slim feature is formed.

14. The method as set forth in claim 13, wherein:

the at least one sidewall comprises a plurality of sidewalls; and the correspond slim feature comprises a plurality of slim features.

15. The method as set forth in claim 12, wherein the first exposure process and the second exposure process are performed in either order.

16. The method as set forth in claim 12, wherein the first opaque area comprises a plurality of opaque blocks.

17. The method as set forth in claim 12, wherein the second opaque area comprises a plurality of opaque blocks.

18. The method as set forth in claim 12, wherein the second dimension d2 is larger than the first dimension d1.

19. The method as set forth in claim 12, wherein the second dimension d2 is equal to the first dimension d1.

20. The method as set forth in claim 12, wherein the second dimension d2 is smaller than the first dimension d1.

21. The method as set forth in claim 12, wherein the second dose is smaller than the first dose.

22. The method as set forth in claim 12, wherein the second dose is equal to the first dose.

23. The method as set forth in claim 12, wherein the second dose is larger than the first dose.

24. The method as set forth in claim 12, wherein the first exposure process comprises an off-axis illumination.

25. The method as set forth in claim 12, wherein the first mask and the second mask comprise at least one of a binary mask, a phase shift mask, and a chromeless mask.

26. The method as set forth in claim 12, wherein the first exposure process and the second exposure process are performed with at least one of a projection exposure tool and a contact printing tool.

27. The method as set forth in claim 12, wherein the first mask and the second mask are formed of different types of materials.

28. The method as set forth in claim 12, wherein the photosensitive layer comprises a plurality of layers of photosensitive material.

29. The method as set forth in claim 12, wherein the first opaque area and the second opaque area are located on the same mask.

30. A method of forming a feature pattern in a photosensitive layer, comprising:

forming the photosensitive layer on a substrate;

providing a first mask having a predetermined number of first opaque areas thereon;

performing a first exposure process with a first dose using the first mask as a photo-mask to form a first unexposed image, which defines features corresponding to the predetermined number in the photosensitive layer;

performing a second exposure process with a second dose to expose sidewalls of the features of the first unexposed image, wherein a second unexposed image is formed in the photosensitive layer; and developing the photosensitive layer with a development process to form the feature pattern and to define the features apart from at least portions of the exposed sidewalls, to thereby create slim features corresponding to the predetermined number and having smaller widths than widths of the features which would result in developing the photosensitive layer of the first unexposed image.

31. The method as set forth in claim 30, wherein:

during the first exposure sidewalls of the first unexposed image receive at least a portion of the first dose;

during the second exposure sidewalls of the first unexposed image in addition to having received at least a portion of the first dose also receive at least a portion of the second dose; and at least one sidewall receives an amount of the first dose which is below a threshold level required for formation of a corresponding one of the slim features, but receives an amount of the second dose to raise a cumulative exposure thereof above the threshold level so that during the development process a corresponding slim feature is formed.

32. A method of forming a feature pattern in a photosensitive layer, comprising:

forming the photosensitive layer on a substrate;

providing a first mask having a first opaque areas disposed at predetermined locations thereon;

performing a first exposure process with a first dose using the first mask as a photo-mask to form a first unexposed image, which defines features at the locations in the photosensitive layer;

performing a second exposure process with a second dose to expose sidewalls of the features of the first unexposed image, wherein a second unexposed image is formed in the photosensitive layer; and developing the photosensitive layer with a development process to form the feature pattern and to create at the locations slim features having smaller widths than widths of the features which would result in developing the photosensitive layer of the first unexposed image.

33. The method as set forth in claim 32, wherein:

during the first exposure sidewalls of the first unexposed image receive at least a portion of the first dose;

during the second exposure sidewalls of the first unexposed image in addition to having received at least a portion of the first dose also receive at least a portion of the second dose; and at least one sidewall receives an amount of the first dose which is below a threshold level required for formation of a corresponding one of the slim features, but receives an amount of the second dose to raise a cumulative exposure thereof above the threshold level so that during the development process a corresponding slim feature is formed.

34. A method of forming a feature pattern in a photosensitive layer, comprising:

forming the photosensitive layer on a substrate;

providing a first mask having a first opaque area thereon;

performing a first exposure process with a first dose using the first mask as a photo-mask to form a first unexposed image in the photosensitive layer;

performing a second exposure process with a second dose to expose sidewalls of the first unexposed image, wherein a second unexposed image is formed in the photosensitive layer; and developing the photosensitive layer with a development process to form the feature pattern and to create slim features having smaller widths than those which would result in developing the photosensitive layer of the first unexposed image;

wherein during the first exposure sidewalls of the first unexposed image receive at least a portion of the first dose;

wherein during the second exposure sidewalls of the first unexposed image in addition to having received at least a portion of the first dose also receive at least a portion of the second dose;

wherein the first opaque area has a first dimension $d1$;

wherein the performing of the second exposure process is preceded by providing a second mask having a second opaque area thereon, the second opaque area having a second dimension $d2$; and wherein the photosensitive layer comprises a plurality of layers of photosensitive material.

* * * * *